(12) United States Patent
Martin et al.

(10) Patent No.: US 8,748,921 B2
(45) Date of Patent: Jun. 10, 2014

(54) SEMICONDUCTOR LIGHT EMITTING DEVICE WITH PRE-FABRICATED WAVELENGTH CONVERTING ELEMENT

(75) Inventors: Paul S. Martin, Pleasanton, CA (US); Gerd O. Mueller, San Jose, CA (US); Regina B. Mueller-Mach, San Jose, CA (US); Helena Ticha, Srch (CZ); Ladislav Tichy, Srch (CZ)

(73) Assignee: Philips Lumileds Lighting Company LLC, San Jose, CA (US)

( * ) Notice: Subject to any disclaimer, the term of this patent is extended or adjusted under 35 U.S.C. 154(b) by 909 days.

(21) Appl. No.: 12/403,926

(22) Filed: Mar. 13, 2009

(65) Prior Publication Data
US 2009/0173960 A1   Jul. 9, 2009

Related U.S. Application Data

(62) Division of application No. 10/863,980, filed on Jun. 9, 2004, now Pat. No. 7,553,683.

(51) Int. Cl.
*H01L 33/00* (2010.01)

(52) U.S. Cl.
USPC ............. 257/98; 257/99; 257/100; 257/103; 257/E33.061; 257/E33.063

(58) Field of Classification Search
USPC ....... 257/98, 99, 100, 103, E33.061, E33.063
See application file for complete search history.

(56) References Cited

U.S. PATENT DOCUMENTS

| | | | |
|---|---|---|---|
| 2,857,541 A | 10/1958 | Etzel | |
| 4,825,084 A | 4/1989 | Braunlich et al. | |
| 5,376,580 A | 12/1994 | Kish et al. | |
| 5,502,316 A | 3/1996 | Kish et al. | |
| 5,813,753 A | 9/1998 | Vriens et al. | |
| 5,959,316 A | 9/1999 | Lowery | |
| 6,084,250 A | 7/2000 | Jüstel et al. | |
| 6,155,699 A | 12/2000 | Miller et al. | |
| 6,194,743 B1 | 2/2001 | Kondoh et al. | |
| 6,255,670 B1 | 7/2001 | Srivastava et al. | |
| 6,294,800 B1 | 9/2001 | Duggal et al. | |
| 6,417,019 B1 | 7/2002 | Mueller et al. | |

(Continued)

FOREIGN PATENT DOCUMENTS

| | | |
|---|---|---|
| JP | 1998215002 A | 8/1998 |
| JP | 11068166 A | 3/1999 |

(Continued)

OTHER PUBLICATIONS

Regina Mueller-Mach et al., "High Power Phosphor-Converted Light Emitting Diodes Based on III-Nitrides," IEEE Journal on Selected Topics in Quantum Electronics, vol. 8, No. 2, Mar./Apr. 2002, pp. 339-345.

(Continued)

*Primary Examiner* — Andy Huynh (57) ABSTRACT

A semiconductor light emitting device is provided with a separately fabricated wavelength converting element. The wavelength converting element, of e.g., phosphor and glass, is produced in a sheet that is separated into individual wavelength converting elements, which are bonded to light emitting devices. The wavelength converting elements may be grouped and stored according to their wavelength converting properties. The wavelength converting elements may be selectively matched with a semiconductor light emitting device, to produce a desired mixture of primary and secondary light.

10 Claims, 4 Drawing Sheets

(56) References Cited

U.S. PATENT DOCUMENTS

| | | |
|---|---|---|
| 6,504,301 B1 | 1/2003 | Lowery |
| 6,576,930 B2 | 6/2003 | Reech et al. |
| 6,630,691 B1 | 10/2003 | Mueller-Mach et al. |
| 6,642,618 B2 | 11/2003 | Yagi et al. |
| 6,696,703 B2 | 2/2004 | Mueller-Mach et al. |
| 6,717,355 B2 | 4/2004 | Takahashi |
| 6,800,857 B2 | 10/2004 | Kajiwara et al. |
| 6,809,340 B2 | 10/2004 | Kato et al. |
| 6,812,500 B2 | 11/2004 | Reeh et al. |
| 6,858,456 B2 | 2/2005 | Noguchi |
| 6,940,092 B2 | 9/2005 | Yoshida et al. |
| 2002/0030194 A1 | 3/2002 | Camras et al. |
| 2002/0084745 A1 | 7/2002 | Wang et al. |
| 2002/0187571 A1 | 12/2002 | Collins, III et al. |
| 2003/0003613 A1 | 1/2003 | Hsieh et al. |
| 2003/0108820 A1 | 6/2003 | Baret et al. |
| 2004/0079955 A1 | 4/2004 | Furukawa |
| 2004/0145895 A1 | 7/2004 | Ouderkirk et al. |
| 2004/0188639 A1 | 9/2004 | Masuda et al. |
| 2005/0023545 A1 | 2/2005 | Camras et al. |
| 2005/0062140 A1 | 3/2005 | Leung et al. |
| 2005/0206301 A1* | 9/2005 | Ng .............................. 313/501 |
| 2005/0253158 A1 | 11/2005 | Yasukawa et al. |
| 2005/0266771 A1 | 12/2005 | Wiswesser |

FOREIGN PATENT DOCUMENTS

| | | |
|---|---|---|
| JP | 200002222 A | 1/2000 |
| JP | 2001111117 A | 4/2001 |
| JP | 2002076434 A | 3/2002 |
| JP | 2002118292 | 4/2002 |
| JP | 2002141559 | 5/2002 |
| JP | 200241144 | 8/2002 |
| JP | 2002246651 A | 8/2002 |
| JP | 2003332622 A | 11/2003 |
| JP | 200415063 | 1/2004 |
| JP | 2004119743 A | 4/2004 |
| WO | 2005027576 A2 | 3/2005 |

OTHER PUBLICATIONS

H. Takebe et al "Refractive Index Dispersin of Tellurite Glasses in the Region. . . " Journal of the American Ceramic Society USA Sep. 1994, vol. 77, No. 9, p. 2455-2457.

* cited by examiner

SEMICONDUCTOR LIGHT EMITTING DEVICE WITH PRE-FABRICATED WAVELENGTH CONVERTING ELEMENT

CROSS REFERENCE TO RELATED APPLICATIONS

This application is a division of application Ser. No. 10/863,980, filed Jun. 9, 2004 and incorporated herein by reference.

FIELD OF THE INVENTION

The present invention relates to semiconductor light emitting devices, and, more particularly to semiconductor light emitting devices with wavelength converting elements.

BACKGROUND

With the development of efficient light emitting diodes (LEDs) that emit blue or ultraviolet (UV) light, it has become feasible to produce LEDs that generate white light through phosphor conversion of a portion of the primary emission of the LED to longer wavelengths. Conversion of primary emission of the LED to secondary emissions with longer wavelengths is commonly referred to as down-conversion of the primary emission. As used herein, "primary light" or "primary emission" refers to light emitted by a light emitting diode and "secondary light" or "secondary emission" refers to light emitted by a phosphor. The unconverted primary light combines with the secondary light to produce white light.

Currently, state-of-the-art phosphor-converted LEDs are produced by mixing a phosphor in a binding medium, such as epoxy, silicone, or other similar material, which are used to encapsulate the LED. The phosphor is generally in the form of a powder that is mixed into the binding medium prior to curing. The uncured slurry containing the phosphor powder is deposited over the LED die and cured.

Figure 1:
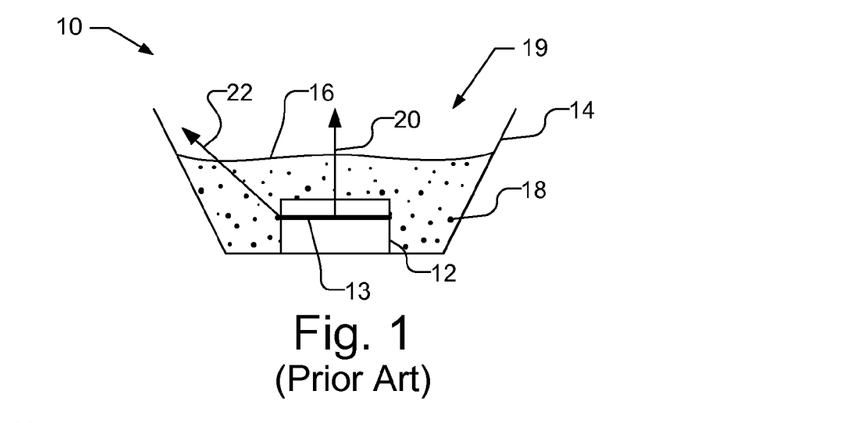
FIG. 1 illustrates a conventional phosphor converted light emitting diode.

FIG. 1 illustrates an example of a conventional phosphor converted LED 10. The phosphor converted LED 10 includes an LED die 12 that is disposed within a reflective cup 14. The LED die 12 is encapsulated with the binding medium 16, in which phosphor particles 18 have been mixed. The binding medium 16 and phosphor particle 18 mixture will be sometimes referred to as the phosphor/epoxy mixture 19. Once the phosphor/epoxy mixture 19 is deposited over the LED die 12, the mixture is cured.

The refractive index of the mixture 19 controls the light outcoupling from the die 12 to the phosphor particles 18, as well as the light extraction from the phosphor particles 18. The refractive index of the phosphor/epoxy mixture 19 typically is only about 1.5. Moreover, the binding medium 16 conventionally used is organic and sensitive to high light flux and elevated temperatures.

The phosphor particles 18 generally are randomly oriented and interspersed throughout the binding medium 16. In operation, a portion of the primary light emitted from the active region 13 of the LED die 12 passes through the phosphor/epoxy mixture 19 without impinging on the phosphor particles 18, and is emitted by the LED lamp 10. Another portion of the primary light impinges on the phosphor particles 18, which converts the light to longer wavelengths, i.e., the phosphor particles 18 absorbs the primary light and produces a secondary emission of light with longer wavelengths. The secondary light is emitted by the LED 10 along with the unconverted primary light and slightly modified primary light (by absorption in the phosphor). The resulting correlated color temperature (CCT) of the light is thus, a function of the wavelengths of the primary light, the wavelengths of the secondary light, and the conversion efficiency of the phosphor/epoxy mixture 19, i.e., the percentage of the primary light that is converted into secondary light and is emitted by the LED 10.

A disadvantage of using a phosphor/epoxy mixture 19 is that the uniformity of the CCT in the light emitted by the LED lamp 10 is difficult to obtain. One reason for the lack of uniformity is caused by the travel distance of the emitted light through the phosphor/epoxy mixture 19. For example, as illustrated in FIG. 1, primary light emitted from the active region 13 of LED die 12 along the path illustrated by arrow 20 has a relatively short path through the phosphor/epoxy mixture 19 compared to the primary light emitted along the path illustrated by arrow 22. Accordingly, light produced by LED 10 along path 20 will have more primary light than light produced along path 22. Thus, the color of the light emitted by the LED 10 will vary depending on the viewing angle.

Moreover, conventional methods of producing phosphor-converted LEDs result in a wide variation in the CCT from one LED lamp to the next. As discussed above, the resulting CCT is dependent on factors such as the wavelengths of the primary light and the conversion efficiency of the phosphor/epoxy mixture 19. Typically, there is a small variation in the wavelengths of the light emitted from one LED die 12 to the next. Moreover, the conversion efficiency of the phosphor/epoxy mixture 19 typically varies from one device to the next. The conversion efficiency is difficult to control as it is the result of such things as non-uniformity in the sizes of the phosphor particles 18 and the settling of the phosphor particles 18 within the binding medium 16. Thus, a mixture of phosphor particles 18 and binding medium 16 that results in a desired CCT for one LED die 12 may not produce the same CCT with another LED.

Accordingly, in practice, to obtain a phosphor-converted LED lamp with a desired CCT, a number of phosphor-converted LED lamps must be produced. The LED lamps are tested to determine which, if any, produce light with the desired CCT. The LED lamps that fail to produce the desired CCT are discarded or used for other purposes.

SUMMARY

In accordance with an embodiment of the present invention, a semiconductor light emitting device is produced with a separately fabricated wavelength converting element. The wavelength converting element may be produced, e.g., of phosphor and an inorganic binding medium, such as glass. A material with a high refractive index may be used to improve extraction of the light from the die as well as the phosphor particles. Moreover, in one embodiment a low softening point binding medium may be used. The wavelength converting elements may be grouped and stored according to their wavelength converting properties. The wavelength converting elements may be selectively matched with a semiconductor light emitting device, to produce a desired mixture of primary and secondary light.

Thus, in accordance with one aspect, a method includes producing a sheet of an inorganic binder and embedded wavelength converting material and producing a plurality of wavelength converting elements from the sheet. In one embodiment, one of the plurality of wavelength converting elements may then be bonded to a semiconductor light emitting device die.

In another aspect, a sheet of a binder and embedded wavelength converting material is produced and a plurality of wavelength converting elements is produced from the sheet.

The light conversion properties of the plurality of wavelength converting elements are measured. The wavelength converting elements can then be grouped and stored based on the light conversion properties.

In yet another aspect, a light emitting device comprises a stack of layers, which include semiconductor layers having an active region, and an inorganic wavelength converting element that is bonded to the stack of layers.

DETAILED DESCRIPTION

Figure 2:
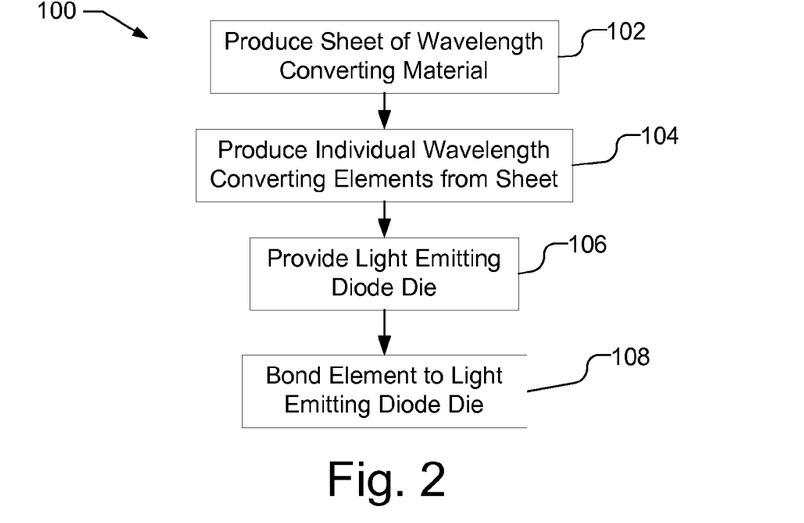
FIG. 2 is a flow chart for producing a wavelength converted semiconductor light emitting device, in accordance with an embodiment of the present invention.

FIG. 2 is a flow chart 100 of producing a wavelength converted semiconductor light emitting device, in accordance with an embodiment of the present invention. In accordance with this embodiment, a light emitting device is produced with a wavelength converting element that is produced independently and then bonded to the semiconductor light emitting device. The wavelength converting element may be, e.g., a phosphor impregnated glass.

Figure 3:
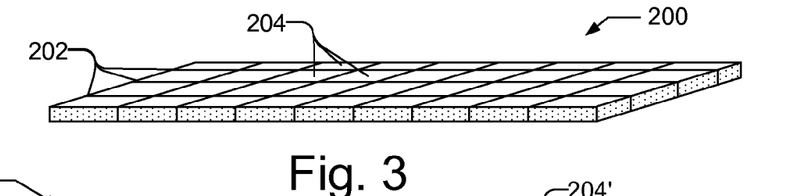
FIG. 3 illustrates a perspective view of a sheet of wavelength converting material.

As illustrated in FIG. 2, a sheet of the wavelength converting material is produced (block 102). FIG. 3 illustrates a perspective view of one embodiment of a sheet 200 of wavelength converting material. The sheet of wavelength converting material may be produced using, e.g., a phosphor or other similar luminescent material, that is dispersed in an inorganic material, such as glass. The use of an inorganic material as the binder is advantageous as it avoids the temperature and light flux sensitivity conventionally found in organic binders, such as epoxy.

In one embodiment, the sheet 200 of wavelength converting material is glass with a low softening point, e.g., less than approximately 400° C. A low softening point glass is used as it advantageously limits the exposure of the phosphor material to excessive heat, which may deteriorate the quantum efficiency (QE) of the phosphor. Additionally, it is desirable for the glass to have a high index of refraction for the light that is emitted by the LED die to which it is be bonded. For example, an index of refraction greater than approximately 1.6 may be used advantageously with the present invention. More preferably, an index of refraction that is equal to or greater than approximately 1.8 may be used. The use of a high index of refraction advantageously provides high conversion efficiency for the wavelength converting material. In one embodiment, the index of refraction of the glass is matched to the index of refraction of the outcoupling surface material of the LED to increase extraction efficiency. For example, where the LED has a "flip-chip" type architecture, the index of refraction of the glass is matched to the LED substrate, which may be, e.g., sapphire having an index of refraction of approximately 1.8. In addition, the index of refraction of the glass may be matched to the index of refraction of the phosphor particles, which for YAG is approximately 1.8.

It should be noted that in some conventional processes, a glass binding medium is used with phosphor. The glass binding medium, however, is selected for its low index of refraction, which increases scattering thereby increasing the mixing of the primary light and the converted light. In accordance with an embodiment of the present invention, however, the function of mixing the primary light and the converted light is separated from function of converting the primary light to the secondary light, as will be discussed below.

In one embodiment, the sheet 200 of wavelength converting material may be formed, e.g., using a "high temperature method." A well homogenized mixture of phosphor, e.g., approximately 10 to 20 vol % of YAG,n, and a powered glass (e.g., $(GeO_2)_{0.33}(TeO_2)_{0.3}(PbO)_{0.27}(CaO)_{0.1}$ or $(GeO_2)_{0.23}(TeO_2)_{0.4}(PbO)_{0.27}(CaO)_{0.1}$) is inserted into a quartz crucible. If desired, other types of crucibles may be used such as a Pt crucible. The crucible is inserted into, e.g., an electrical furnace preheated to 800° C. to 950° C. depending on the volume fraction of YAG,n. If desired, other types of furnaces may be used, such as high frequency furnaces or microwave furnaces. After the glass mixture melts, the melt is homogenized in the furnace. After approximately ten to thirty minutes of melting and homogenization, the melt is poured onto a plate, e.g., a stainless steel plate. The melt is pressed on the sheet at around 250° C. to form the sheet 200. The refractive index in the glass prepared in this manner was found to be approximately 1.8.

In another embodiment, the sheet 200 may be formed using the glass from PbO and anhydrous $B_2O_3$ (e.g., $(PbO)_{0.34}(B_2O_3)_{0.66}$). A well homogenized mixture of phosphor, e.g., approximately 10 to 20 vol % of YAG,n, and powered $(PbO)_{0.34}(B_2O_3)_{0.66}$ is inserted into, e.g., a quartz crucible. The crucible is inserted into e.g., an electric furnace preheated to 800° C. to 950° C. depending on the volume fraction of YAG,n. After the glass mixture melts, the melt is homogenized in the furnace. After approximately ten to thirty minutes of melting and homogenization, the melt is poured onto a plate, e.g., a stainless steel plate. The melt is pressed on the sheet at around 250° C. to form the sheet 200.

The phosphor material or other wavelength converting material that is embedded in the sheet 200 may be selected based on the desired wavelengths of the secondary light. By way of example, one suitable phosphor that may be used with a blue light emitting device in order to produce white light is $Y_3Al_5O_{12}$:Ce (YAG:Ce). If desired other phosphors may be used, including, but are not limited to: $Gd_3,Ga_5O_{12}$:Ce, (Lu, Y)$_3Al_5O_{12}$:Ce, SrS:Eu, $SrGa_2S_4$:Eu, (Sr,Ca,Ba)(Al,Ga)$_2S_4$: Eu, (Ca,Sr)S:Eu, (Ca,Sr)S:Eu,Mn, (Ca,Sr)S:Ce, $(Sr,Ba,Ca)_2Si_5N_8$:Eu, $(Ba,Sr,Ca)_2SiO_4$ Eu, and $(Ca,Sr,Ba)Si_2O_2N_2$:Eu.

Figure 4:
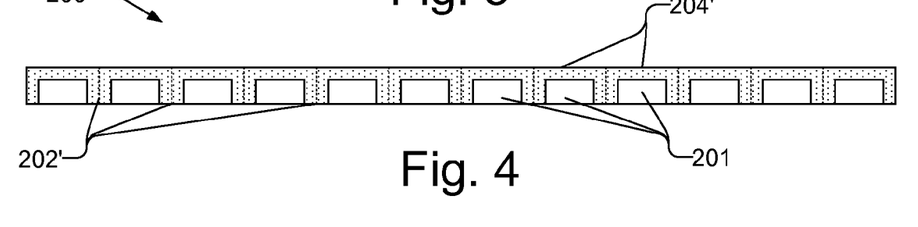
FIG. 4 illustrates a cross-sectional view of a molded sheet of wavelength converting material.

The poured melt of glass and phosphor may be permitted to harden in a flat sheet 200, as illustrated in FIG. 3. Alternatively, the sheet may be molded with desired features. For example, a cross-sectional view of a sheet 200' is illustrated in FIG. 4 as having a number of indentations 201, each of which is approximately the size of an LED die. The sheet 200 may be molded to include other features. For example, the sheet may be molded to include a number of lens elements.

In another embodiment, the sheet 200 is produced using a sol-gel process. The desired phosphor or phosphors are dispersed within the sol-gel glass during formation. A sol-gel glass process is described in U.S. Pat. No. 6,642,618, which is incorporated herein by reference.

It should be understood that sheet 200 may be produced using materials other than glass and phosphor. For example, other adequately transparent binding materials may be used.

Referring back to FIG. 2, once the sheet 200 of wavelength converting material is hardened, the sheet 200 is separated into a number of individual elements (block 104). The individual wavelength converting elements are sized to be mounted over an LED die. Various methods may be used to separate the sheet 200 into individual elements, such as dicing, hot stamping, cutting, scoring and breaking, or any other appropriate method. FIG. 3 illustrates score lines 202 on sheet 200 that may be used to produce the individual wavelength converting elements 204. FIG. 4 similarly illustrates elements 204' formed from score lines 202' between indentations 201 on sheet 200'.

A semiconductor light emitting device die is then provided (block 106). The semiconductor light emitting device may be, e.g., a light emitting diode chip or an array of chips. For ease of reference, the semiconductor light emitting device will sometimes be referred to herein as an LED die. In one embodiment, the LED die may be a mounted die, e.g., that is mounted in a reflector cup or a submount. Alternatively, the LED die may be unmounted. A wavelength converting element is then bonded to the LED die (block 108).

Figure 5A:
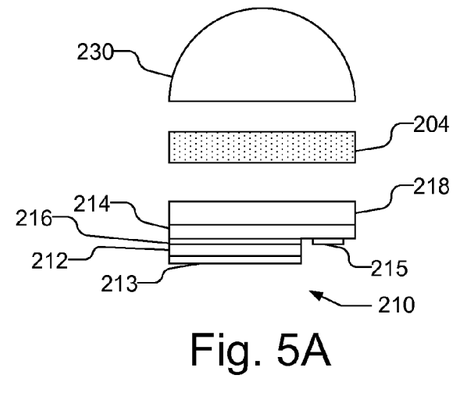
FIG. 5A illustrates a wavelength converting element, an LED die and a transparent optical element that are to be bonded to each other.
Figure 5B:
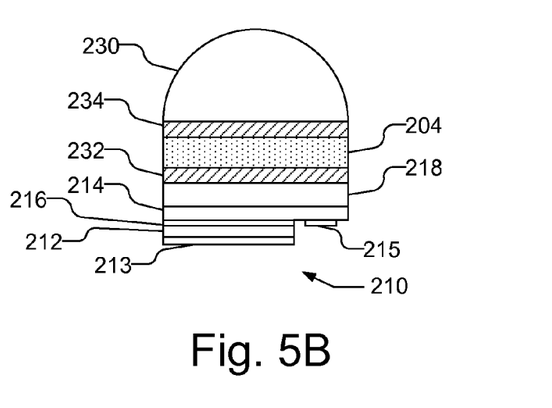
FIG. 5B illustrates a wavelength converting element, an LED die and a transparent optical element bonded together with bonding layers.

FIG. 5A illustrates a wavelength converting element 204, an LED die 210 and a transparent optical element 230 that are to be bonded to each other. FIG. 5B illustrates the element 204, LED die 210 and transparent optical element 230 bonded together with transparent bonding layers 232 and 234. In general, the wavelength converting element 204 may be bonded to LED die 210 in a manner described in U.S. Ser. No. 09/880,204, published on Mar. 14, 2002 with Publication No. US 2002/0030194 A1, which has the same assignee as the present disclosure, and U.S. Pat. Nos. 5,502,316, and 5,376,580, all of which are incorporated herein by reference.

LED die 210 illustrated in FIGS. 5A and 5B is a stack of layers including a first semiconductor layer 212 of p-type conductivity (p-layer) and a second semiconductor layer 214 of n-type conductivity (n-layer). Semiconductor layers 212 and 214 are electrically coupled to active region 216. Active region 216 is, for example, a p-n diode junction associated with the interface of layers 212 and 214. Alternatively, active region 216 includes one or more semiconductor layers that are doped n-type or p-type or are undoped. LED die 210 includes a transparent substrate 222, which is formed from a material such as, e.g., sapphire, SiC, GaN, or GaP. LED die 210 also includes p-contact 213 and n-contact 215 that are electrically coupled to semiconductor layers 212 and 214, respectively. Active region 216 emits light upon application of a suitable voltage across contacts 213 and 215. In alternative implementations, the conductivity types of layers 212 and 214, together with contacts 213 and 214, are reversed. That is, layer 212 is an n-type layer, contact 213 is an n-contact, layer 214 is a p-type layer, and contact 215 is a p-contact.

Semiconductor layers 212 and 214 and active region 216 are formed from III-V semiconductors including but not limited to AlN, AlP, AlAs, AlSb, GaN, GaP, GaAs, GaSb, InN, InP, InAs, InSb, II-VI semiconductors including but not limited to ZnS, ZnSe, CdSe, CdTe, group IV semiconductors including but not limited to Ge, Si, SiC, and mixtures or alloys thereof.

Contacts 213 and 215 are, in one implementation, metal contacts formed from metals including but not limited to gold, silver, nickel, aluminum, titanium, chromium, platinum, palladium, rhodium, rhenium, ruthenium, tungsten, and mixtures or alloys thereof. In another implementation, one or both of contacts 213 and 215 are formed from transparent conductors such as indium tin oxide.

Although FIGS. 5A and 5B illustrate a particular LED structure, the present invention is independent of any particular structure of the LED die. For example, the number of substrates and semiconductor layers in LED die 210 and the detailed structure of active region 216 may be varied. Additionally, LED die 210 is illustrated in FIGS. 5A and 5B as having a "flip-chip" type architecture, i.e., the contacts 213 and 215 are located on the same side of the LED die 210. If desired, however, other types of LED die architecture may be used with the present invention, such as having the contacts 213 and 215 on opposite sides of the die.

In one embodiment, a layer of bonding material is applied to the top surface of LED die 210 (FIG. 5A) to form a transparent bonding layer 232 (FIG. 5B) with which the element 204 is bonded. A second layer of bonding material is applied over the element 204 to form bonding layer 234 (FIG. 5B) to bond an optical component, such as lens 230. Transparent bonding layers 232 and 234 are, for example, about 10 Angstroms to about 100 microns thick. The bonding material may be applied, for example, using conventional deposition techniques including but not limited to spinning, sputtering, evaporation, chemical vapor deposition (CVD), or as part of material growth by, for example, metal-organic chemical vapor deposition (MOCVD), vapor phase epitaxy (VPE), liquid phase epitaxy (LPE), or molecular beam epitaxy (MBE).

Figure 6:
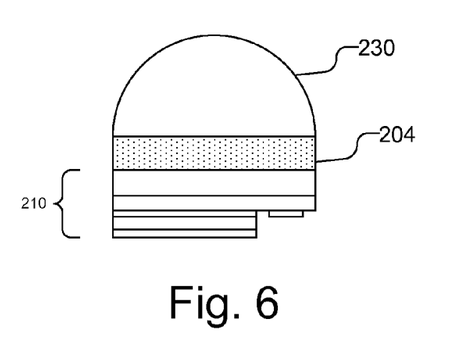
FIG. 6 illustrates a wavelength converting element 204 bonding a lens to the LED die.

Alternative methods may be used to bond the element 204 to the LED die 210. For example, bonding layers 232 may be omitted and the element 204 may be bonded directly to the LED die 210. In one embodiment, bonding layer 234 may be used to the lens 230 to the element 204, which is directly bonded to the LED die 210. In another embodiment, the element 204 is bonded to the LED die 210, e.g., by bonding layer 232, and the lens 230 is bonded directly to the element 204. In yet another embodiment, shown in FIG. 6, the element 204 may be used to bond the lens 230 to the LED die 210. The use of low softening point glass to form the element 204 is particularly advantageous when bonding element 204 directly to either the LED die or the lens 230. The materials may be bonded, e.g., by elevating the temperature of the LED die 210, element 204, and lens 230 to, e.g., 500° C., and applying a pressure to press the materials together.

Figure 7:
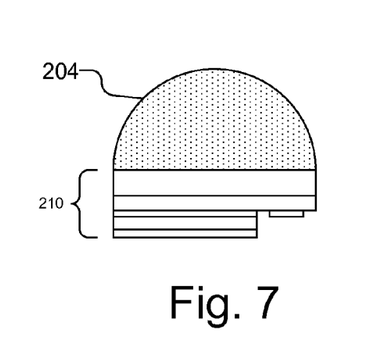
FIG. 7 illustrates a wavelength converting element that is bonded to the LED die and shaped to form a lens.

FIG. 7 illustrates another embodiment, in which the wavelength converting element 204 is bonded directly to the LED die 210 and is used as, e.g., a lens element. The wavelength converting element 204 may be shaped with the desired shape, e.g., by molding the glass melt during production of the sheet, by hot pressing the element 204 once the element 204 is bonded to the LED die 210, or by cutting, crowing and polishing the element 204.

Figure 8:
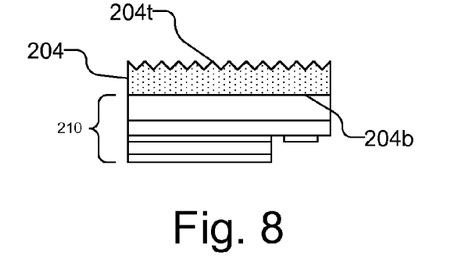
FIG. 8 illustrates a wavelength converting element having a roughened top surface and bonded to an LED die.

FIG. 8 illustrates another embodiment, in which the element 204 is bonded directly to the LED die 210 and the top surface 204t of the element 204 is roughened. No lens is illustrated in FIG. 8, but if desired, a lens may be bonded to the element 204 or mounted over the element 204 but not directly bonded to the element 204. Roughening the top surface 204t of the element 204 is useful to scatter the converted light to improve light outcoupling, particularly, e.g., when the element 204 has a high index of refraction. In another embodiment, the bottom surface 204b of the element 204 may be roughened for better adhesion to the LED die 210. The top, bottom or both surfaces of the element 204 may be roughened, e.g., mechanically, such as by grinding with a course powder. Alternatively, the element may be roughened chemically, e.g., by etching away part of the glass to partially expose a portion of the embedded phosphor particles. The top surface 204t of the element 204 may be roughened prior to or after bonding, and the bottom surface 204b would be roughened prior to bonding.

Figure 9:
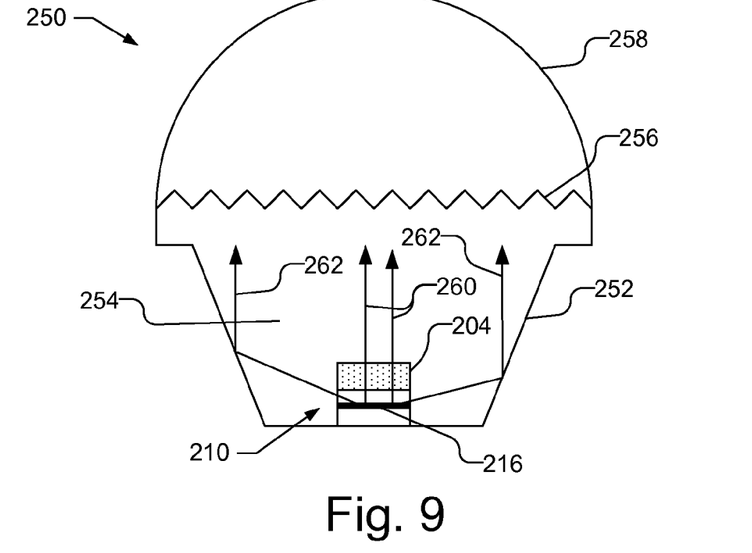
FIG. 9 illustrates a light emitting device in which the light conversion function and light mixing function are separated.

FIG. 9 illustrates a device 250, in which the wavelength converting element 204 is bonded to an LED die 210 and is mounted in a reflector cup 252. The active region 216 of the LED die 210 is shown in FIG. 9 for reference. The reflector cup 252 may be filled with an encapsulant 254, such as silicon or epoxy or polymethyl methacrylate (PMMA). The encapsulant 254 includes a top surface 256 that is roughened and a lens 258 or other optical element that overlies the encapsulant 254. In one embodiment, the top surface 256 of the encapsulant 254 may be patterned, e.g., with a Fresnel type lens. If desired, a brightness enhancement filter may be deposited between the encapsulant 254 and the lens 258.

As illustrated in FIG. 9, a portion of the blue light emitted from the active region 216 is received by wavelength converting element 204 and is converted to yellow light, illustrated as arrows 260. The thickness and phosphor content of the element 204 may be configured to convert a desired percentage of primary light that is incident on element 204. Another portion of the blue light emitted by the active region 216, however, is not incident on the element 204 and is therefore not converted, illustrated as arrows 262. The yellow converted light and the blue primary light are mixed by the encapsulant, e.g., by the roughened surface 256, to produce white light. Thus, the converting and mixing functions are separated in device 250. Of course, other colored light may be produced with the device 250.

Figure 10A:
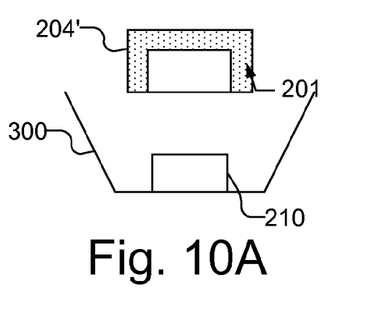
FIG. 10A illustrates a molded wavelength converting element to be bonded to an LED die.

FIG. 10A illustrates an embodiment, in which a molded element 204', e.g. with indentation 201, is mounted to an LED die 210 in a reflective cup 300. It should be understood that if desired, the reflective cup 300 may be obviated. As illustrated in FIG. 10A, the indentation 201 in element 204' is approximately the same size as the LED die 210. Thus, when element 204' is placed over the LED die 210, as illustrated in FIG. 10B, the top and sides of the LED die 210 are covered by the element 204'.

Figure 10B:
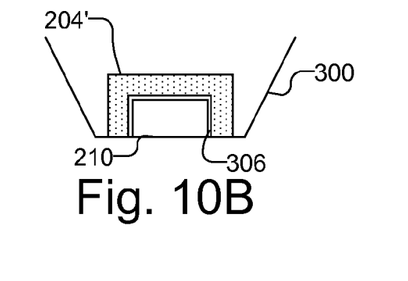
FIG. 10B illustrates a molded wavelength converting element bonded to an LED die.

As illustrated in FIG. 10B, the element 204' may be fixed to the LED die 210, e.g., by placing a bonding layer 306, of a high temperature optically transparent material, such as epoxy, silicone or the like, between the element 204' and the LED die 210. By way of example, the bonding material may be placed within the indentation 301 of the element 204' prior to placing the element 204' on the LED die 210. When cured, the bonding layer 306 holds the element 204' to the LED die 210.

Figure 10C:
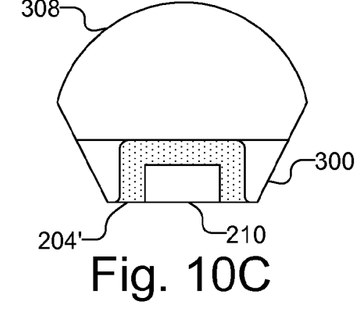
FIG. 10C illustrates another embodiment of a molded wavelength converting element bonded to an LED die.

In another embodiment, the element 204' may be heated until it beings to flow and conforms to the LED die 210, as illustrated in FIG. 10C. By way of example, the element 204' may be heated by placing the entire device, i.e., LED die 210 and element 204' on a heated plate. A lens 308 with a high temperature softening point may be fused to the element 204' when the element is heated. Thus, the element 204' acts as both a phosphor conversion layer as well as a bonding layer between the LED die 210 and a glass lens 308.

In the embodiment in which the element 204' is attached to the LED die 210 by heating the element 204' until the element softens, the LED die 210 should have a high temperature attachment that can tolerate the increase in temperature when the element 204' is heated. For example, an LED die such as that described in U.S. Ser. No. 10/652,348, entitled "Package for a Semiconductor Light Emitting Device", by Frank Wall et al., filed Aug. 29, 2003, having the same assignee as the present disclosure and which is incorporated herein by reference.

Figure 10D:
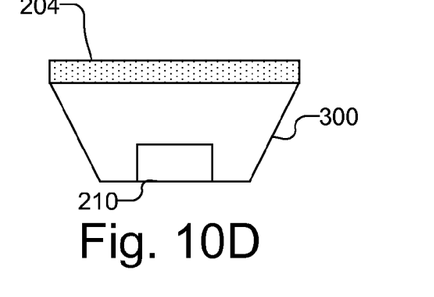
FIG. 10D illustrates another embodiment in which the wavelength converting element is remotely mounted to an LED die.

FIG. 10D illustrates another embodiment, in which the element 204 is remotely mounted over the LED 210. As illustrated in FIG. 10D, there is an air gap between the LED 210 and the element 204. In another embodiment, a bonding material may be disposed between the LED 210 and the element 204. In another embodiment, the element 204 may be mounted over multiple LEDs 210.

In accordance with another embodiment of the present invention, the conversion properties, i.e., conversion efficiency and wavelength of secondary light, of the individual wavelength converting elements 204 are measured prior to being bonded to an LED die. Because the mixture of phosphor particles and glass may vary from one sheet to the next, as well as vary across the length of any single sheet 200, the conversion properties of each wavelength converting element may vary. Similarly, light emitting properties typically vary from one LED die to the next. Accordingly, to produce a device with a particular range of wavelengths, each wavelength converting element 204 is pre-measured so that it can be matched with an appropriate LED die.

Figure 11:
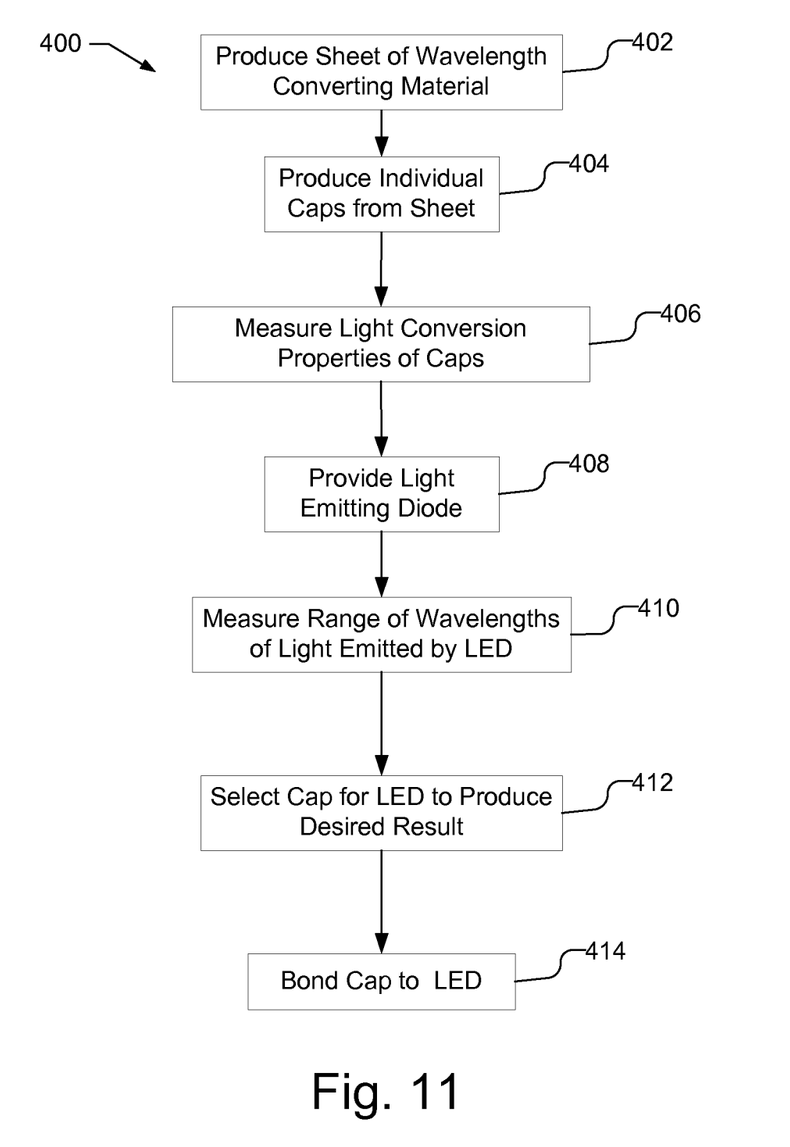
FIG. 11 is a flow chart of a method of selectively matching a wavelength converting element to an LED die to produce a desired mix of primary and secondary light.

FIG. 11 is a flow chart 400 illustrated a method of selectively matching an element to an LED die to produce a desired mix of primary and secondary light. As shown in FIG. 11, a sheet of wavelength converting material is produced (block 402) and individual wavelength converting elements are produced from the sheet (block 404) as discussed above.

The light conversion properties of the wavelength converting elements are then measured (block 406). To measure the conversion properties of each element, the element is illuminated with light having a known wavelength and the converted light, or the mixture of converted and primary light, is measured.

It should be understood that if desired, the conversion properties of individual elements may be measured before or after separation. Measuring the conversion properties of the wavelength converting elements while the elements are still in a sheet is advantageous as the measurements may be performed in parallel.

In accordance with one embodiment of the present invention, the wavelength converting elements may be binned, i.e., grouped and stored, according to their light conversion properties. By grouping and storing the elements based on their light conversion properties, the manufacturing of phosphor converted LEDs can be greatly simplified, as a wavelength converting element having a desired light conversion property can be easily located and matched with an LED die to produce a desired result.

As shown in FIG. 11, an LED die is provided (block 408) and the range of wavelengths emitted by the LED die is measured (block 410). Based on the measured wavelengths emitted by the LED die and desired mixture of wavelengths, a wavelength converting element having the appropriate light conversion properties can be then be selected (block 412). The selected element is then mounted to the LED die (block 414), e.g., in a manner such as that described above.

Although the present invention is illustrated in connection with specific embodiments for instructional purposes, the present invention is not limited thereto. Various adaptations and modifications may be made without departing from the scope of the invention. For example, the sheet and elements may be manufactured from materials other than phosphor and glass. Further, any wavelength converting material may be used in place of phosphor. Therefore, the spirit and scope of the appended claims should not be limited to the foregoing description.

What is claimed is:

1. A light emitting device comprising:
   a stack of layers including semiconductor layers having an active region;
   an inorganic wavelength converting element bonded to the stack of layers;
   a reflective cup in which the stack of layers and the inorganic wavelength converting element are disposed;
   an encapsulant disposed over the stack of layers and the inorganic wavelength converting element, wherein a top surface of the encapsulant is patterned to mix light emitted from the active region and converted light emitted by the inorganic wavelength converting element; and
   an optically transparent element overlying the encapsulant.

2. The light emitting device of claim 1, wherein the inorganic wavelength converting element is a bonding layer between the stack of layers and the optically transparent element.

3. The light emitting device of claim 1, wherein the inorganic wavelength converting element has an index of refraction that is greater than approximately 1.6.

4. The light emitting device of claim 1, wherein the inorganic wavelength converting element has an index of refraction that is greater than approximately 1.8.

5. The light emitting device of claim 1, wherein the inorganic wavelength converting element has a glass softening temperature of less than approximately 400° C.

6. The light emitting device of claim 1, wherein the inorganic wavelength converting element has approximately the same area as the top surface of the stack of layers.

7. The light emitting device of claim 1, wherein the top surface of the encapsulant has a roughened surface that mixes the light emitted from the active region and the converted light emitted by the inorganic wavelength converting element.

8. The light emitting device of claim 1, wherein the top surface of the encapsulant forms a Fresnel lens that mixes the light emitted from the active region and the converted light emitted by the inorganic wavelength converting element.

9. The light emitting device of claim 1, wherein the inorganic wavelength converting element has an indentation, the stack of layers extending into the indentation.

10. The light emitting device of claim 1, wherein the inorganic wavelength converting element comprises phosphor embedded into a glass.

\* \* \* \* \*